United States Patent
Burke et al.

Patent Number: 5,802,459
Date of Patent: Sep. 1, 1998

[54] PERIPHERAL DEVICE HAVING A COMMUNICATION PORT FOR CABLE OR WIRELESS MODULE CONNECTION

[75] Inventors: Randal A. Burke, Grays Lake, Ill.; Dean D. Stewart, Snellville, Ga.

[73] Assignee: NCR Corporation, Dayton, Ohio

[21] Appl. No.: 602,481

[22] Filed: Feb. 20, 1996

[51] Int. Cl.⁶ .................................................. H04Q 1/00
[52] U.S. Cl. ........................................ 455/90; 340/825
[58] Field of Search ........................ 340/825, 825.56, 340/825.69, 825.72; 345/169; 235/375, 462; 379/93.7; 186/39; 455/347, 349, 351, 90, 74, 74.1

[56] References Cited

U.S. PATENT DOCUMENTS

| | | |
|---|---|---|
| 1,677,268 | 7/1928 | Brown . |
| 3,824,472 | 7/1974 | Engel et al. ........................ 325/355 |
| 3,831,063 | 8/1974 | Keough ........................ 317/101 D |
| 3,896,384 | 7/1975 | Henderson ........................ 325/352 |
| 4,180,711 | 12/1979 | Hirata et al. ........................ 200/5 A |
| 4,415,065 | 11/1983 | Sandstedt ........................ 186/39 |
| 4,506,344 | 3/1985 | Hubbard ........................ 364/900 |
| 4,509,210 | 4/1985 | Kohn ........................ 455/349 |
| 4,625,275 | 11/1986 | Smith ........................ 364/401 |
| 4,625,276 | 11/1986 | Benton et al. ........................ 364/408 |
| 4,758,714 | 7/1988 | Carlson et al. ........................ 235/380 |
| 4,847,798 | 7/1989 | Kurashima ........................ 364/708 |
| 4,850,009 | 7/1989 | Zook et al. ........................ 379/93.7 |
| 4,853,676 | 8/1989 | Kitts ........................ 340/543 |
| 4,856,088 | 8/1989 | Oliwa et al. ........................ 455/349 |
| 4,916,441 | 4/1990 | Gombrich ........................ 345/169 |
| 4,933,988 | 6/1990 | Thibault ........................ 455/349 |
| 4,945,443 | 7/1990 | DeBiasi et al. ........................ 361/93 |
| 4,980,522 | 12/1990 | Murakami et al. ........................ 200/5 |
| 5,012,075 | 4/1991 | Hutchison et al. ........................ 235/379 |
| 5,166,868 | 11/1992 | Stanton et al. ........................ 361/422 |
| 5,175,873 | 12/1992 | Goldenberg et al. ........................ 455/89 |
| 5,193,047 | 3/1993 | Barratt et al. ........................ 361/212 |
| 5,202,825 | 4/1993 | Miller et al. ........................ 364/405 |
| 5,203,021 | 4/1993 | Repplinger et al. ........................ 455/90 |
| 5,218,188 | 6/1993 | Hanson ........................ 235/375 |
| 5,219,067 | 6/1993 | Lima et al. ........................ 200/302.2 |
| 5,289,785 | 3/1994 | MacPherson et al. ........................ 109/42 |
| 5,359,182 | 10/1994 | Schilling ........................ 235/380 |
| 5,371,348 | 12/1994 | Kumar et al. ........................ 235/472 |
| 5,373,458 | 12/1994 | Bishay et al. ........................ 364/708.1 |
| 5,404,491 | 4/1995 | Huzenlaub et al. ........................ 395/500 |
| 5,416,310 | 5/1995 | Little ........................ 235/462 |

Primary Examiner—Edwin C. Holloway, III
Attorney, Agent, or Firm—Paul W. Martin

[57] ABSTRACT

A peripheral device which has wireless or cable modes of operation. The peripheral device includes a port for allowing the peripheral device to communicate with a host computer, and which at any given time connects to only a first transceiver for wirelessly communicating with a second transceiver coupled to the host computer or to a cable which is coupled to the host computer. The peripheral device includes a housing which has a chamber for containing the first transceiver when the first transceiver is connected to the port and for containing an end portion of the cable when the cable is connected to the port.

2 Claims, 5 Drawing Sheets

PERIPHERAL DEVICE HAVING A COMMUNICATION PORT FOR CABLE OR WIRELESS MODULE CONNECTION

CROSS-REFERENCE TO RELATED APPLICATIONS

The present invention is related to the following commonly assigned and co-pending U.S. applications:

"Tamper Detection and Memory Erasing Circuit for a Secure Peripheral Device", Ser. No. 08/602,482, now abandoned.

"A Fluid Isolation and Dispersion System for Tactile Input Devices", U.S. Pat. No. 5,681,122.

BACKGROUND OF THE INVENTION

The present invention relates to peripheral devices, and more specifically to a peripheral device having a communication port for cable or wireless module connection.

Peripheral devices are typically manufactured as wireless devices or cable connected devices. When there has been a need to use a peripheral device as both a wireless device and a cable connected device, manufacturers have been forced to produce two different device models to accommodate both types of communication methods. This approach is very costly and limits device upgradability.

Therefore, it would be desirable to provide a peripheral device which can communicate by cable connection or by any one of a variety of wireless communication methods. Thus, it would be desirable to provide a peripheral device that includes a common base module and a common method of connecting to each of the communication devices.

SUMMARY OF THE INVENTION

In accordance with the teachings of the present invention a peripheral device having a communication port for cable or wireless module connection is provided.

The peripheral device includes a port for allowing the peripheral device to communicate with a host computer, and which at any given time connects to only a first transceiver for wirelessly communicating with a second transceiver coupled to the host computer or to a cable which is coupled to the host computer.

The peripheral device also includes a housing which has a chamber for containing the first transceiver when the first transceiver is connected to the port and for containing an end portion of the cable when the cable is connected to the port.

It is accordingly an object of the present invention to provide a peripheral device having a communication port for cable or wireless module connection.

It is another object of the present invention to provide a single model of peripheral device, which obviates the need for two models of the same peripheral device, one model that wirelessly communicates with a host computer, and another model that uses a cable to communicate with the host computer.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DETAILED DESCRIPTION OF THE PREFERRED EMBODIMENT

Figure 1:
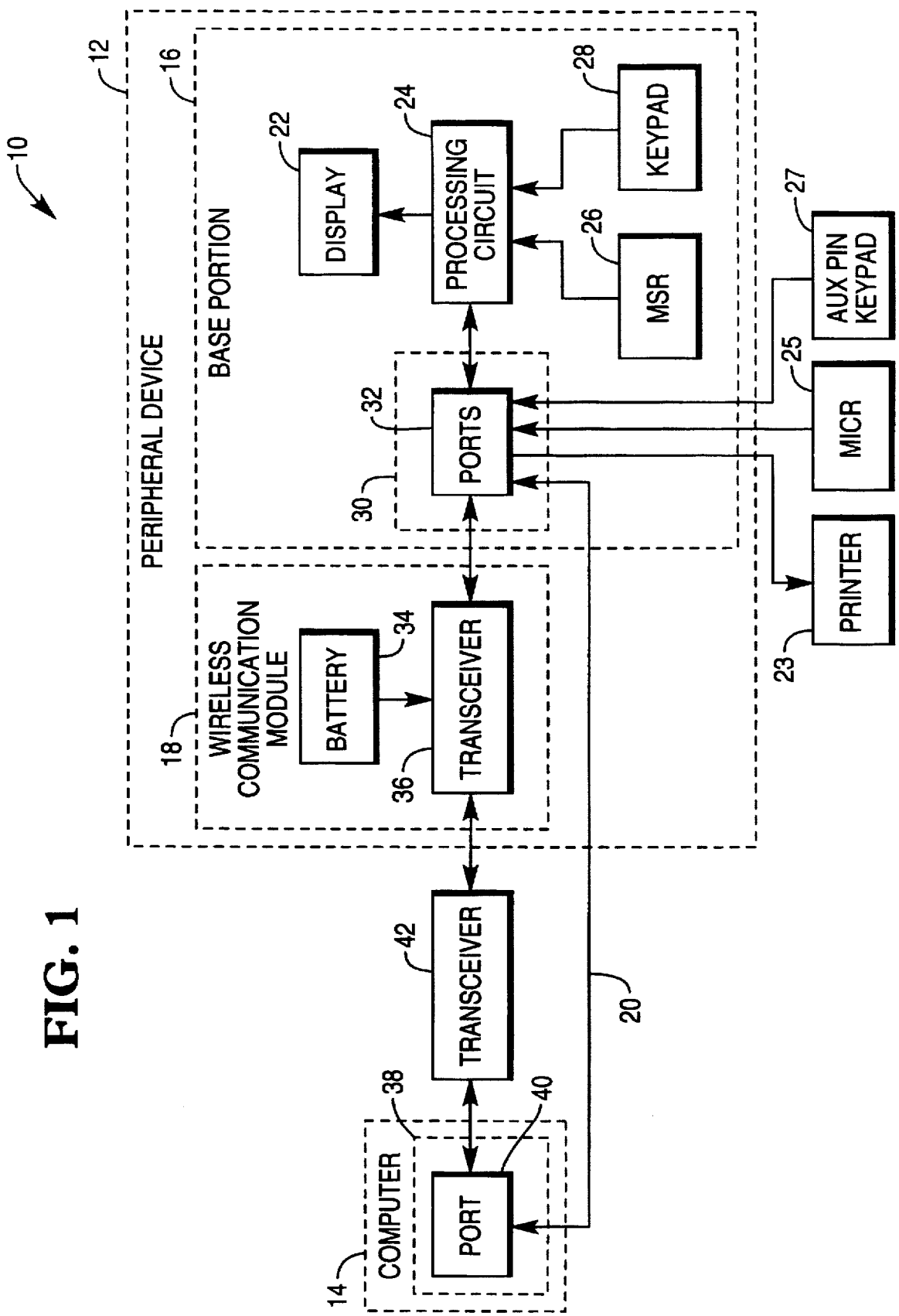
FIG. 1 is a block diagram of a system which includes a peripheral device in accordance with the present invention.

Referring now to FIG. 1, system 10 primarily includes peripheral device 12 and computer 14.

Peripheral 12 includes base portion 16 and either wireless communication module 18 or one or more cables 20a–d.

Base portion 16 primarily includes display 22, processing circuit 24, keypad 28, and communication circuit 30. When peripheral 16 is an electronic funds transfer device, peripheral 16 additionally includes card reader 26, which is any suitable card reader, such as a magnetic stripe reader (MSR). Other peripherals or combinations of peripherals are also envisioned by the present invention. For example, ports 32 may be used to connect a printer 23, magnetic ink character reader (MICR) 25, and an auxiliary personal identification number (PIN) keypad 27.

Display 14 displays transaction information.

Keypad 28 records personal identification numbers (PINs). In a transaction establishment, keypad 28 records other keystrokes by remotely located store personnel as necessary to complete a transaction. In a checkout environment, device 12 is preferably mounted facing the customer side of a checkout stand. In this case, auxiliary PIN keypad 27 is mounted on the checker side and used by the checker to enter PINs and output signals from keypad 27 are ignored by computer 14.

Card reader 26 reads information from a payment card, such as credit or debit card.

Communication circuit 30 includes one or more communication ports 32 which provide a physical and electrical connection to wireless communication module 18 or cables 20.

It is a feature of the present invention that communication ports 32 are used by both communication module 18 and cables 20, but not at the same time.

Processing circuit 24 controls operation of device 12.

Communication module 18 includes transceiver 36 and battery 34.

Transceiver 36 wirelessly communicates with computer 14 through transceiver 42. When device 12 is an EFT device, transceiver 36 transmits payment and PIN information to computer 14 and may receive return or status messages from computer 14. Transceiver 36 is preferably an RF transceiver, although other types of wireless transceivers, such as infrared, are also envisioned.

Battery 34 provides power to transceiver 36.

Computer 14 may be a server, client terminal, or stand-alone computer. When device 12 is an EFT device, computer 14 is preferably a server or terminal. Computer 14 also preferably interacts with a bank network to process requests for payment via credit or debit card and verify PINs.

Computer 14 includes communication circuitry 38, which includes a port 40, to which wireless transceiver 42 is connected or to which cable 20a is connected. Alternatively, transceiver 42 may be built into communication circuitry 38 with an internal antenna or an external antenna. Transceiver 42 is preferably an RF transceiver, although other types of wireless transceivers, such as infra-red, are also envisioned.

Figure 2:
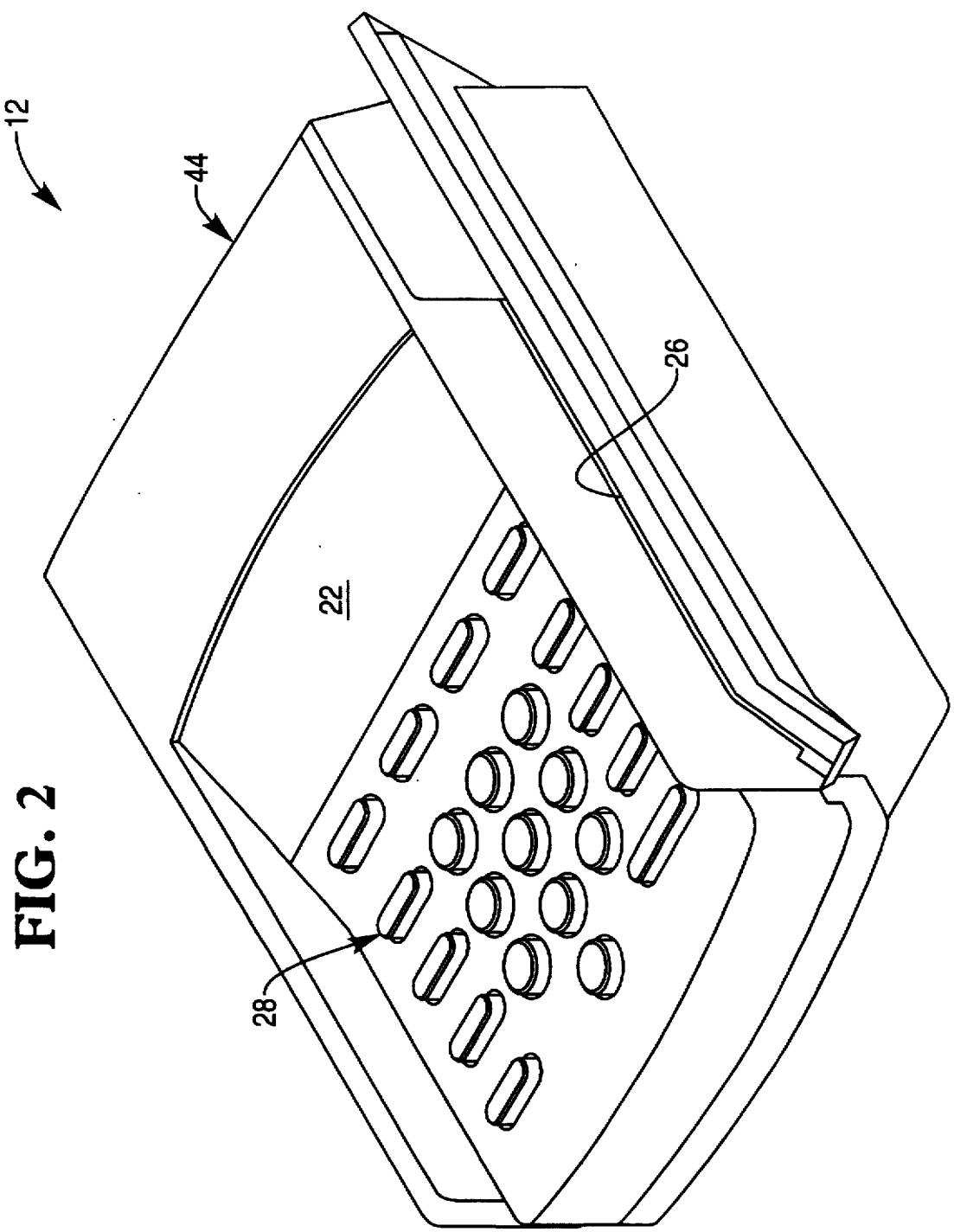
FIG. 2 is a perspective view of one type of peripheral device, an electronic funds transfer (EFT) device.

Turning now to FIG. 2, an example of a peripheral device 12 is shown and includes an EFT device. Device 12 is portable and includes a housing 44 preferably made of lightweight but durable plastic. Display 22, keypad 28, and card reader 26 are also shown.

Figure 3:
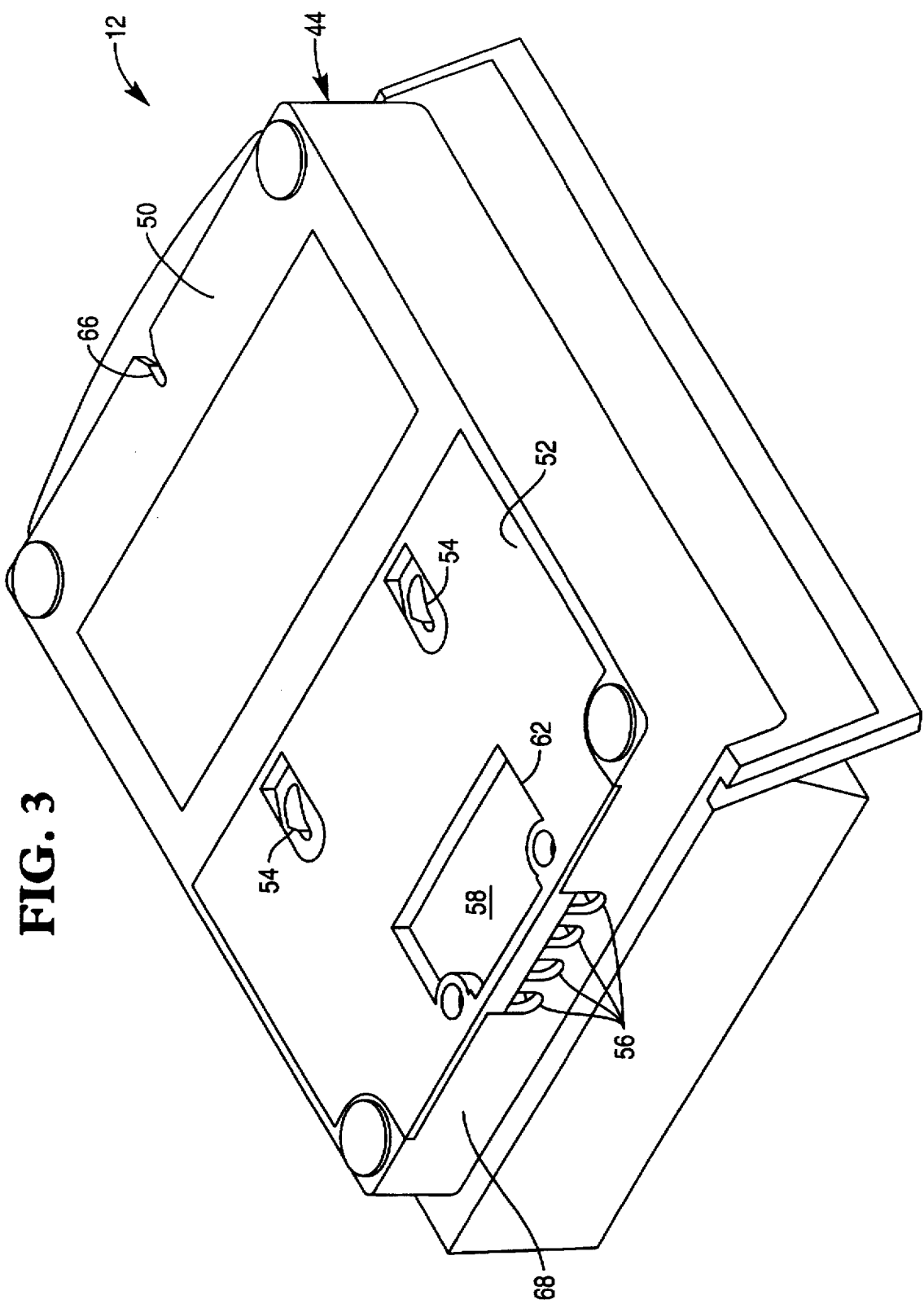
FIG. 3 is a bottom perspective view of the peripheral device.

Turning now to FIG. 3, device 12 is shown bottom side up. Bottom side 50 includes an access cover 52 that forms one side of chamber 58. Chamber 58 is slightly larger than wireless communication module 18 to accommodate insertion of wireless communication module 18. When wireless communication module 18 is not inserted, chamber 58 provides space for cables 20a–d. At one end of chamber 58 is a strain relief device 80 through which cables 20a–d pass.

Lower side wall 68 of housing 44 includes apertures 56 adjacent strain relief device 80 through which cables 20a–d pass. Access cover 52 includes aperture 64, which allows cables 20a–d to be routed through access cover 52 instead of apertures 56 when device 12 is securely mounted to a wall. Access cover 52 also includes mounting apertures 54 which together with mounting aperture 66 on bottom side 50 allow device 12 to be secured to a wall or other structure using screws or other appropriate fasteners.

Figure 4:
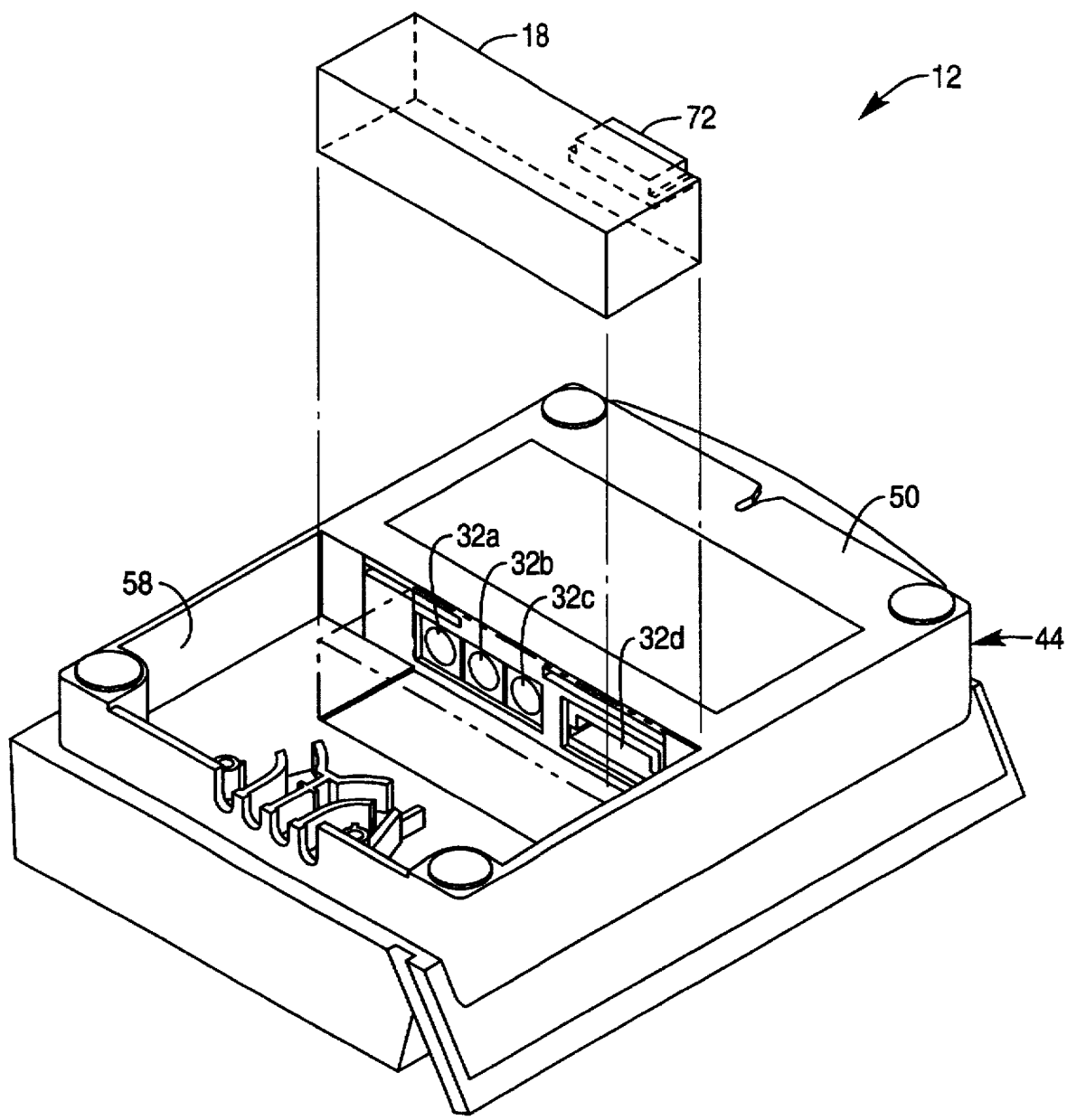
FIG. 4 is a bottom exploded view of the peripheral device with the cover plate removed and with a wireless communication module.

Turning now to FIG. 4, a first configuration of device 12 includes wireless communication module 18. In this configuration, wireless communication module 18 is inserted within chamber 58. Connector 70 on wireless communication module 18 is inserted into port 20d. Access cover 52 is then installed.

Figure 5:
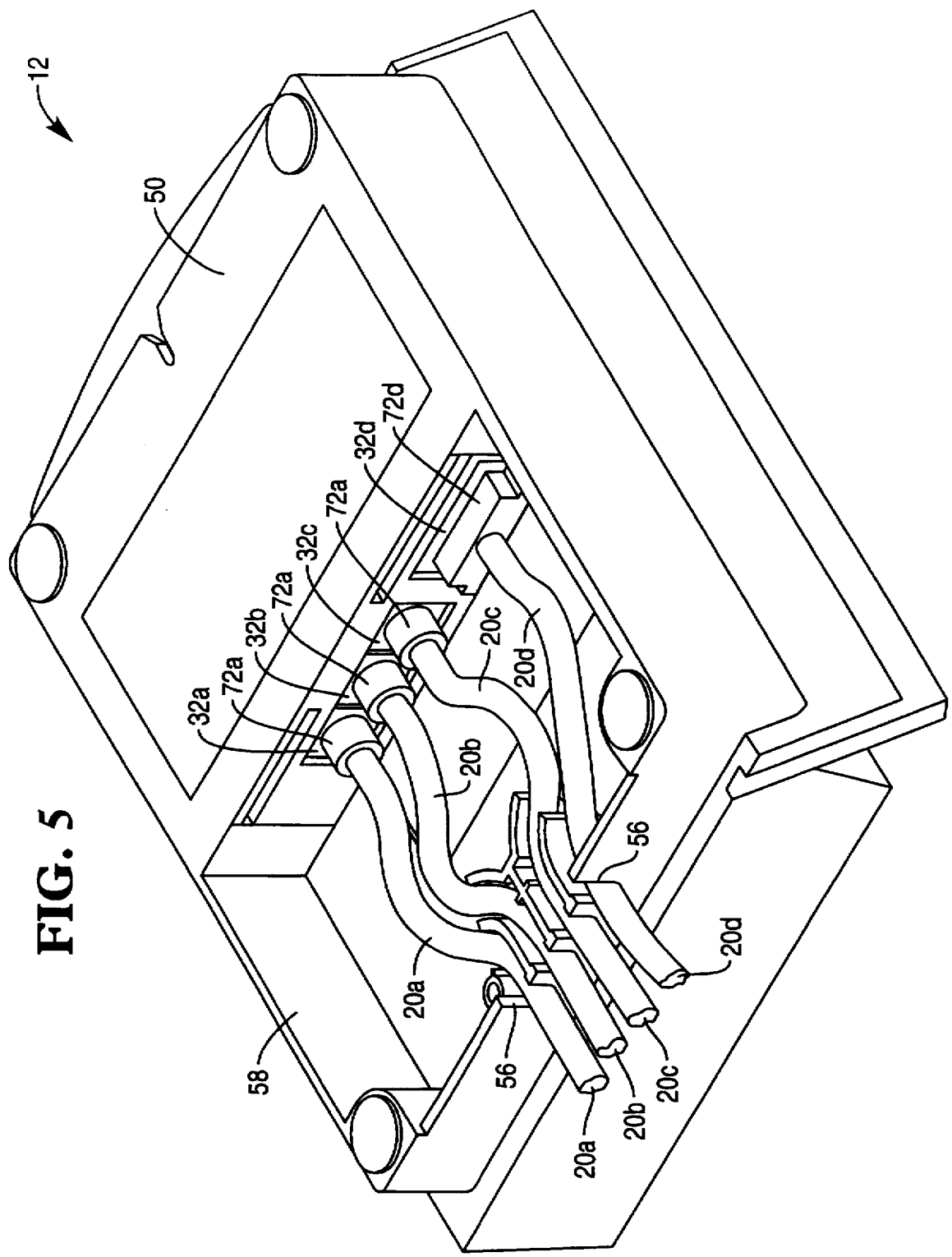
FIG. 5 is a bottom perspective view of the peripheral device with the cover plate removed and with a cable connection.

Turning now to FIG. 5, a second configuration of device 12 includes one or more of cables 20a–d. In this configuration, cable 20d allows device 12 to communicate with computer 14. Connection of cables 20a–c for printer 23, MICR 25, and auxiliary PIN keypad 27 are optional. Cables 20a–d may provide both power and communication signals, or a separate power cable and connector may be employed to provide power to device 12 when device 12 is located in a fixed position.

Cables 20a–d include connectors 72a–d which are inserted into ports 32a–d. Cables 20a–d are secured to strain relief device 80. Access cover 52 is then installed.

Advantageously, the system of the present invention is more cost effective than having two peripheral solutions for wireless and cable operation.

Although the present invention has been described with particular reference to certain preferred embodiments thereof, variations and modifications of the present invention can be effected within the spirit and scope of the following claims.

We claim:

1. A peripheral device comprising:

a housing including a top surface and a bottom surface, wherein the housing includes first and second adjacent chambers, wherein the second chamber includes a removable access cover in the bottom surface of the housing, a first wall extending between the bottom and top surfaces which is common to the first chamber, and a second wall extending between the bottom and top surfaces which includes a number of apertures;

a keypad in the top surface; and control circuitry within the first chamber, including a number of ports mounted within the first wall and accessible from the second chamber for allowing the peripheral device to communicate with a host computer;

wherein the ports, at any given time, are only capable of connection to a wireless transceiver which is inserted within the second chamber and enclosed by the removable access cover or to a number of cables which are routed into the second chamber through the apertures in the second wall.

2. A peripheral device comprising:

a housing including a top surface and a bottom surface, wherein the housing includes first and second adjacent chambers, wherein the second chamber includes a removable access cover in the bottom surface of the housing, a first wall extending between the bottom and top surfaces which is common to the first chamber, and a second wall extending between the bottom and top surfaces which includes a number of apertures;

a keypad in the top surface;

control circuitry within the first chamber, including a number of ports mounted within the first wall and accessible from the second chamber for allowing the peripheral device to communicate with a host computer; and a removable wireless transceiver which is coupled to the ports and which is sealed within the second chamber by the removable access cover;

wherein the ports, at any given time, are only capable of connection to the wireless transceiver or to a number of cables which are routed into the second chamber through the apertures in the second wall if the wireless transceiver is removed.

* * * * *